United States Patent [19]

Staker

[11] 4,082,999
[45] Apr. 4, 1978

[54] PROGRAMMABLE VARIABLE-RATE ELECTRIC ADAPTING DEVICE FOR WATT-HOUR METERS

[76] Inventor: Anthony Gail Staker, 23526 Oxnard St., Woodland Hills, Calif. 91364

[21] Appl. No.: 701,369

[22] Filed: Jun. 30, 1976

[51] Int. Cl.² .................... G01R 15/08; G01R 1/04
[52] U.S. Cl. ..................................... 324/116; 324/156
[58] Field of Search ............... 324/115, 116, 156, 157, 324/137; 307/141, 141.8

[56] References Cited

U.S. PATENT DOCUMENTS

| | | | |
|---|---|---|---|
| 1,573,546 | 2/1926 | Harris | 324/137 |
| 2,601,264 | 6/1952 | Daugherty | 307/141.8 |
| 3,067,362 | 12/1962 | Patton | 324/156 |

FOREIGN PATENT DOCUMENTS

| | | | |
|---|---|---|---|
| 108,959 | 2/1925 | France | 324/116 |

Primary Examiner—James B. Mullins
Assistant Examiner—Ernest F. Karlsen
Attorney, Agent, or Firm—Craig O. Malin

[57] ABSTRACT

A variable-rate electric adapting device for use with a watt-hour meter of the single- or polyphase induction-type, the adapting device being arranged to generate a controlled variable-rate input to the magnetic circuit of the meter to vary the drive of the meter motor in accordance with programmed rate versus time profiles stored in a programming element of the device, the latter being either pre-programmed or continuously programmed by data link. The programming element is arranged to address the adapting device only at discrete intervals of time coinciding with control signals from a timing device. The profile constants may be changed by data links, temperature transducers, voltage amplitude detectors and load detectors. Additional outputs are derived from the programming element to allow individual loads to be connected and disconnected.

1 Claim, 4 Drawing Figures

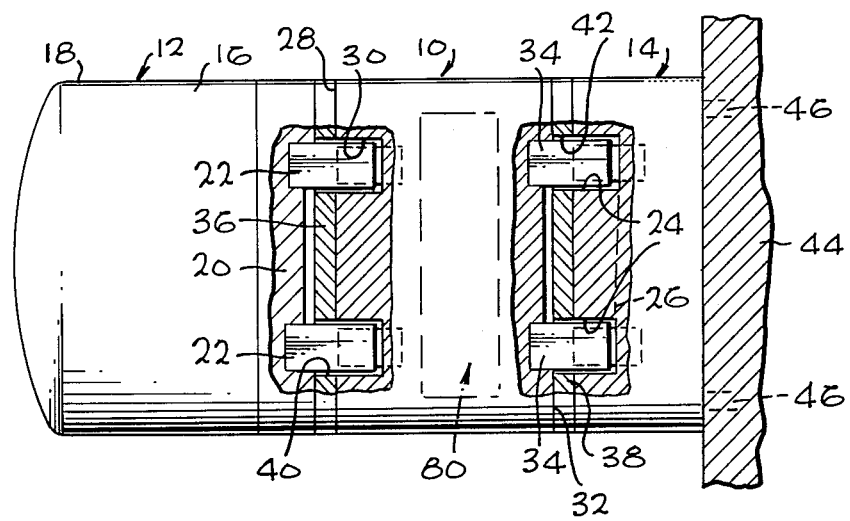
Fig. 1
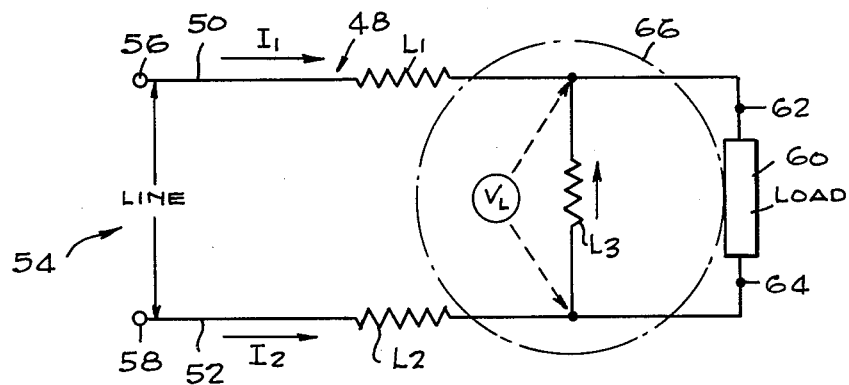
Fig. 2 — PRIOR ART
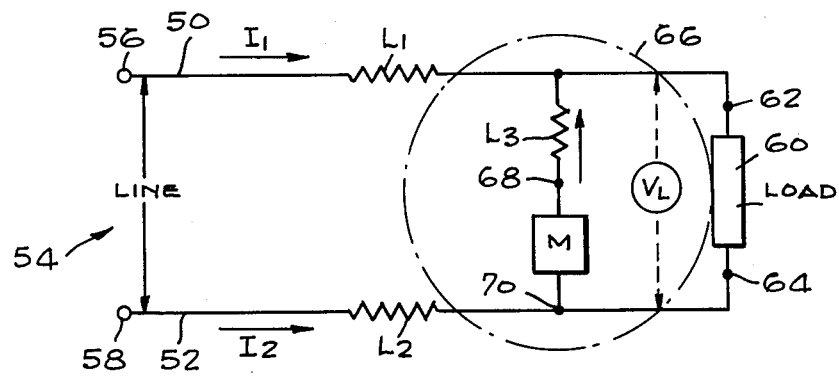
Fig. 3

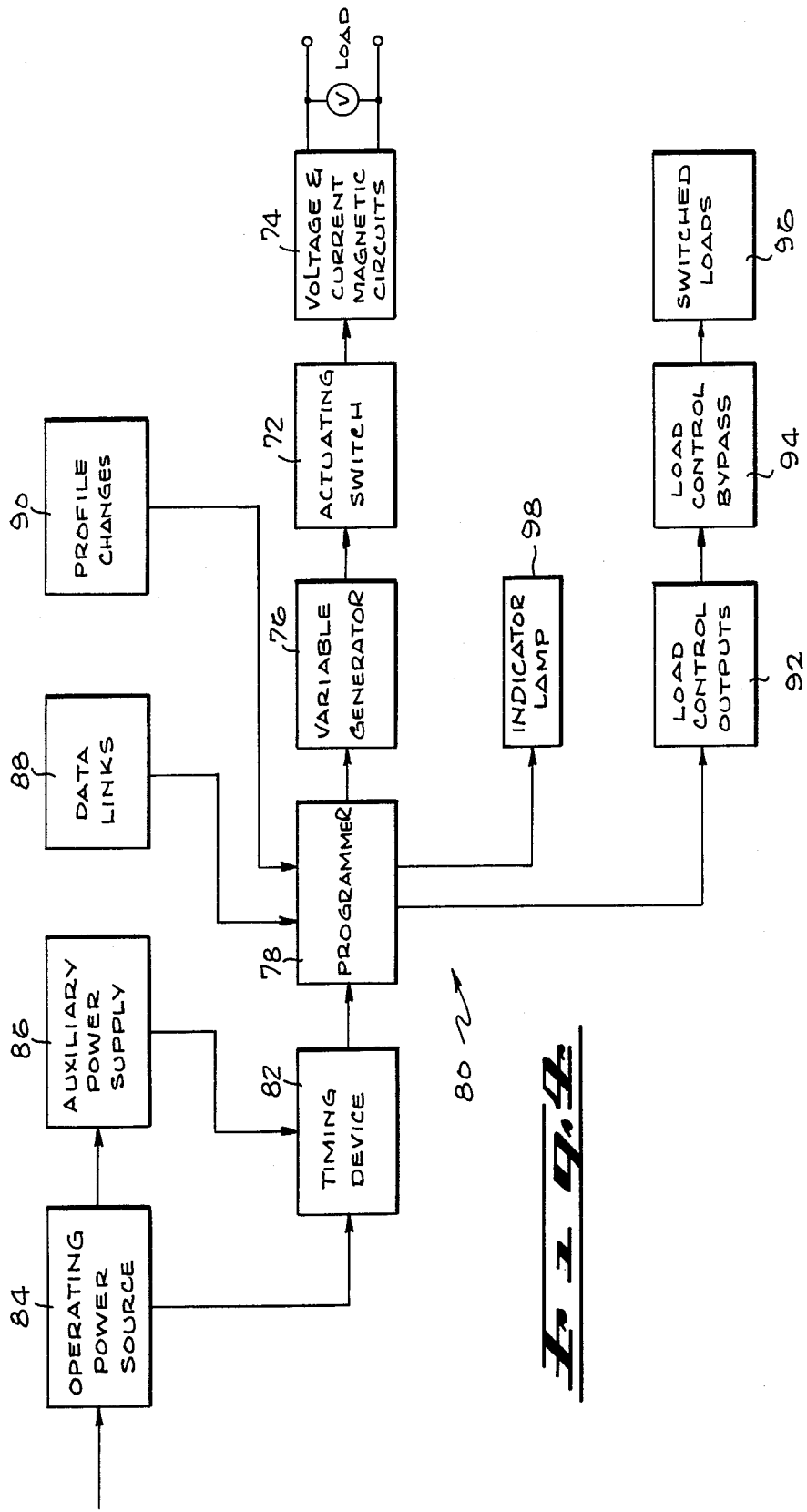

PROGRAMMABLE VARIABLE-RATE ELECTRIC ADAPTING DEVICE FOR WATT-HOUR METERS

BACKGROUND OF THE INVENTION

1. Field of the Invention

This invention relates in general to electric metering and control devices, and more particularly to a programmable variable-rate electric adapting device for use with a watt-hour meter of the single-or polyphase induction type.

2. Introduction

From the standpoint of the utility company, it is desirable that its electric power systems be operated at substantially the same capacity both during "off-peak" periods of power consumption when the load on the power systems is relatively low and during "peak" periods of power consumption when the load on the power system is substantially high, this for reasons of maximum efficiency and economy of operation. Since it is necessary to have a power system with a capacity as great or greater than any power demand that could possibly be made, it is nontheless increasingly difficult for the utility company to keep up with the ever increasing power demands made by the consumers especially during the peak periods with the frequent result of power overloads, black-outs and, consequently, a higher rate for energy used.

Since most consumers of electric power require that it be available for use at one capacity rate or another, it has been proposed that an electric power control and measuring device be provided which differentiates between the energy consumed during peak hours and the energy consumed during the remainder of the day so that an even distribution of loads be maintained.

3. Description of the Prior Art

For example, U.S. Pat. No. 619,302, issued Feb. 14, 1899, to Haskins, disclosed a method of controlling the input power to the armature of a recording watt-hour meter. Rate changes were effected by inserting a series resistor in the armature of the electric drive motor for the meter. The meter had only two rates and they were achieved by a clock-driven arm that allowed the series resistor to be active (non-shorted) or nonactive (shorted).

Another multiple rate meter was disclosed in U.S. Pat. No. 725,798, issued Apr. 21, 1903, to Thompson et al. This meter had a cam-driven rate with a rate profile derived from the load profile of the power-generating plant and the cam varied a series resistance in the motor armature in a more sophisticated manner than did Haskin's invention.

The control and time-keeping devices in those early days were generally hand-wound spring-driven timing devices and if not wound would not operate according to specific requirements with respect to the metering of electric energy. For example, in U.S. Pat. No. 808,279, issued Dec. 26, 1905, to Walter C. Fish, a multirate meter was disclosed which at predetermined hours in a daily period changed from one rate to another by using a spring-driven, hand-wound clock mechanism arranged so as to effect a low-and high-rate registration. The criterion for maintaining the proper time intervals between the low and high energy rates was for the customer to periodically rewind the clock. The patent proposed means to induce customers to use electric energy more freely or at the high rate during a period or periods in the day when the load on the power-generating plant was relatively low. The patent further disclosed means which, in case a customer neglected to rewind the clock, the latter would continue operating at the high rate and the purchaser of the energy would thus be penalized for his failure to rewind the mechanism by having to pay for the high-energy rate regardless of the time when the energy was used.

Variable-rate metering technology underwent a complete change obviating all prior time-of-day rate metering designs when the induction-type watt-hour meter was introduced. This type of watt-hour meter has been used on all new installations and, essentially, comprises an electromagnetic structure which is energizable in accordance with voltage and current of an electrical circuit to establish a shifting magnetic field having a strength proportional to power of the circuit. A suitable electroconductive armature is mounted for rotation relative to the structure under the influence of the magnetic field in accordance with energy of the circuit. The meter further includes a register device which is operable for providing an indication of the number of revolutions of the armature. For this purpose the register device is coupled to the armature by suitable coupling mechanism effective to operate the register device in accordance with rotation of the armature. A damping magnet may be provided for damping to a desired degree rotation of the armature.

As is well known to those skilled in the art, typical induction-type watt-hour meters calculated consumed power by the product VI Cos $\theta$, where V is the rms value of voltage, I the rms value of current, and $\theta$ the angle of displacement between V and I.

SUMMARY OF THE INVENTION

It is an object of the present invention to provide a programmable electrical adapting device which converts existing induction-type watt-hour meters into variable rate meters in which the variable "effective" rate is achieved through a time-sequenced reduction in the rms value of voltage and/or a corresponding phase shift delivered to the voltage coil of the meter. This voltage reduction and/or phase shift is accomplished by the use of resistive, inductive, or capacitive voltage dividers, or time varying discrete functions or a combination thereof, the various electronic components or combinations thereof operating on the incoming line voltage to reduce the voltage to the induction meter voltage coil.

According to the invention, the time-sequenced rate reduction is automatically computed in the meter and is reflected as less watt-hours registered during the reduced rate period. This unique feature obviates the necessity for the utility company to discard existing meters or change their basic meter reading and accounting systems. The effective rate reduction is calculated in the adaptor-meter combination itself by programming the preselected time-dependent reduction or a corresponding phase shift to the induction-meter voltage coil, thus reducing the watt-hour reading.

According to the invention a variable-rate electric adapting device is provided for use with a watt-hour meter of the single-or polyphase induction type, the adapting device being arranged to generate a controlled variable-rate input to the magnetic circuit of the meter to vary the drive of the meter motor in accordance with programmed rate versus time profiles stored in a discrete programming element of the adaptor. The programming element is arranged to address the adapting device only at discrete intervals of time coinciding with control signals from a timing device. The profile constants may be changed as desired by data links which are in the form of radio signals, power-source control line signals, e.g., a ripple system, telephone line or manual means. Also, temperature transducer inputs are coupled to the memory element for separate actuation of different rate structures when desired outside or inside temperatures are reached. Furthermore, the rate profile may be changed by a source line voltage limit sensor or load sensor when these parameters exceed predetermined values. Additional outputs are derived from the programming element to allow individual loads to be connected or disconnected.

For purposes of illustration, the scaling process which produces the desired variable-rate input in the magnetic circuit of the watt-hour meter, is represented as the control function "$m$."

The application which most clearly defines the process is as follows:

$m$ is a modifying process for altering the instantaneous torque of the watt-hour meter motor and may be in the form of a constant or parametrically controlled time stationary or varying function.

The unique process of the invention as applied to the basic mechanism of a standard induction-type watt-hour meter can be expressed by the following equations:

a. Power delivered through the standard watt-hour meter.

$$W = V_L I_L \cos \phi$$

where
- $W$ = Instantaneous power measured
- $V_L$ = Line voltage at the meter
- $I_L$ = Electric current delivered through the meter
- $\cos \phi$ = Power factor of the load and $\theta$ is the phase angle between the voltage and current.

b. The present process applied is wherein the equation is modified as $$(W) m = m (V_L I_L \cos \phi)$$

c. By applying the process control function $m$ to the first term of the power equation $$(W) m = m V_L (I_L \cos \phi)$$

the desired results are achieved, that is, appropriate processing of the $V_L$ term in the equation.

Typically, $m$ appropriately controls in the following manner:

1. The normal line-voltage function is characteristically described as a sinusoidal function and consists of a continuing function that may vary in amplitude and frequency;
2. By controlling the process of voltage and current and, hence, flux in the voltage coil, proper scaling will result as given below:
   (i) Consider 1024 complete sinusoidal cycles of the line voltage;
   (ii) By alternately omitting the energy transmission process of the impressed voltage, the effect of the line voltage $V_L$ on the equation would be alternately 1 or 0. The average value of $m V_L$ equals $(512/1024) V_L$ or $\frac{1}{2} V_L$.
   (iii) The function $m$ can be discrete in omitting a single complete cycle or continuous in omitting successive cycles and/or partial cycles;
   (iiii) The scaling process of $m$ can be mechanized wherein alternate and/or partial cycles are omitted, or in sequential cycles, or any combinaion thereof.

The generation of the process $m$ can be by direct control from a utility distribution system, direct telephone line, radio-controlled device or pre-stored time sequential function in a device with the meter driven by a time source.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 1 is a view in side elevation of a detachable type watt-hour meter in combination with a socket receptacle and the variable-rate adapting device according to the invention;

FIG. 2 is a schematic representation showing circuit connections for the watt-hour meter and socket receptacle of FIG. 1;

FIG. 3 is a schematic representation showing circuit connections for the watt-hour meter, the socket receptacle and the adapting device of FIG. 1; and FIG. 4 is a block schematic diagram of the variable rate adapting device according to the invention.

DESCRIPTION OF THE PREFERRED EMBODIMENT

Referring now to the drawings in which like reference numerals index like parts and with attention initially directed to FIG. 1, there is shown a combination of a programmable variable rate adapting device generally indicated at 10, a watt-hour meter 12 and a socket receptacle 14. The instrument 12 may be in the form of a single-or polyphase induction-type meter.

Although the invention is shown herein as being employed in combination with a watt-hour meter of the induction-type having a socalled "S" base, it will be appreciated by those skilled in the art that such is for illustration purposes only and that the invention is not limited thereto but, contrarily, is adapted for use with any induction-type watt-hour meter. The adapting device according to the invention, can be used with watt-hour meters of different design simply by changing the mechanical configuration of the device. Typically, the invention may, for example, be employed with the commonly-used watt-hour meter having a socalled "A" base in which all the terminals exit to the bottom of the meter and which type of meter does not plug into a socket as is the case with the "A" base meter shown in FIG. 1.

As shown in FIG. 1, the meter 12 is of the detachable type including a cover receptacle 16 for detachable engagement with the socket receptacle 14. The cover receptacle includes a cover 18 preferably formed of transparent material such as glass positioned to surround operating parts of the meter. The cover 18 is suitably secured to a base member 20 which supports the operating parts (not shown). The base member 20 carries a plurality of blades 22, two shown, to which certain of the operating parts are electrically connected.

The socket receptacle 14 is provided with a plurality of contact jaws 24, two shown, which are mounted on suitable insulating support 26 of receptacle 14. The receptacle 14 is provided with a pair of opposed threaded openings (not shown) which houses source and load conductors of an associated circuit (not shown) which are electrically connected to the jaws 24.

Positioned intermediate the meter 12 and socket receptacle is the adapting device 10. Provided in the outer face 28 of device 10 are a plurality of contact jaws 30, two shown, while on the opposite face 32 the device carries a plurality of contact blades 34, two shown.

Conventional security band and lead seals, 36, 38, are positioned on both sides of the device 10. To this end, the seals 36, 38, have a plurality of openings 40, 42, extending therethrough to provide passage of the contact blades 22, 34, respectively. For the purpose of conditioning the meter 12 for energization, the receptacle is positioned relative to the device 10 with the contact blades 22 in engagement with the jaws 30 while the device 10 is positioned relative to socket receptacle 14 with the contact blades 34 in engagement with jaws 24. The respective elements 10, 12, 14 and 36, 38 are shown in a slightly detached relation relative to each other. The socket receptacle 14 is shown as attached to a support structure 44 by suitable bolt members 46.

Referring now to FIG. 2, the watt-hour meter 48 has its first phase conductor 50 and second phase conductor 52 connected across the line source 54 at the terminals 56, 58. The power source may be of varying voltage magnitudes, the most common being 120 or 240 volts. As shown, a load 60 is connected to terminals 62, 64. The load may be of varying characteristics from purely resistive to a complex load of equivalent resistance, capacitance and/or inductance. The line currents $I_1$, $I_2$ drawn by load 60 pass through flux-generating coils $L_1$, $L_2$ in the conductors 50, 52, respectively. The voltage $V_L$ delivered to the load 60 is converted in conventional manner to a flux field and delivered to an integrating disc rotor 66 through potential coil $L_3$ connected between the first and second phase conductors 50, 52. Thus, the driving force to the meter rotor can be expressed as $$F \approx K(I_{L1} + I_{L2}) V_L \cos \phi$$

$$F \approx K(\phi_{L1} + \phi_{L2}) \phi_{L3} \cos \phi$$

This force then provides instantaneous drive to the meter rotor and represents instantaneous watts $$W_i F K I_L V_L \cos \phi$$

where $\cos \phi$ is the local power factor.
When integrated over a time interval, the power consumed is then measured in watt-hours and the characterization equation becomes $$W\text{-hrs} = \int_c^T K I_L V_L \cos \phi \, dt$$

PROGRAMMABLE VARIABLE RATE DEVICE

FIG. 3 illustrates the process of converting the standard induction-type watt-hour meter of FIG. 1 into a variable-rate meter. The meter mechanization per se is unchanged and the same as that shown in FIG. 2. However, the variable-rate meter representing the scaling process and indexed by the symbol $m$ is inserted in series between terminals 68 and 70 with the line voltage measuring field coil $L_3$. The process for generating the variable-rate input defined as $m$ is mechanized in several forms as described hereinafter.

TIME-VARYING DISCRETE PROCESS

Examining the characteristic equation for the watt-hour meter $$W\text{-hrs} = \int_c^T K I_L V_L \cos \phi \, dt$$

applying a time-variant process, and rewriting the equation yields $$W\text{-hrs} = \sum_c^n K I_L V_L \cos \phi$$

where $n$ is the number of intervals used in the summation process. Any of the terms of the equation may be varied in a time-dependent manner to produce the desired variable rate $m$. The equation then becomes $$(W\text{-hrs})m = \sum_c^n M K I_L V_L \cos \phi$$

For the purpose of this description, $m$ is applied to the voltage measuring component, although it can be made to operate properly on any one or several of the terms. The equation then becomes $$(W\text{-hrs})m = K I_L \cos \phi \sum_c^n M V_L$$

$m$ is a discrete process that can have a value of 1 or 0 and its effect when summed over the interval "$n$" then scales the equation in an appropriate manner. For the purposes of example consider the value of $m$ to be 1 or 0 over "$p$" complete cycles of the system line frequency. In the case of power systems this is generally 50, 60, or 400 hrz. Assuming "$p$" has a value of 1024 cycles and values of 1 and 0 for $m$, the following scaling process occurs:

| m | | p | |
|---|---|---|---|
| 1's | 0's | 1024 | m scaling |
| 1024 | 0 | 1024 | 1 |
| . | . | . | . |
| 768 | 256 | 1024 | ¾ |
| . | . | . | . |
| 512 | 512 | 1024 | ½ |
| . | . | . | . |
| 256 | 768 | 1024 | ¼ |
| . | . | . | . |
| 0 | 1024 | 1024 | 0 |

Thus the time-varying discrete process yields the desired scaling of the characteristic equation $$(W\text{-hrs})m = m I_L V_L \cos \phi$$

In application, the highest rate during the process is normalized to unity value of $m$ and all lesser rates are appropriately scaled by the process of making $m$ an appropriately scaled value. The number of cycles "$p$" can be varied to reduce quantization errors in scaling. The alternating values of $m$ (1 or 0) can be randomly programmed during the time interval represented by "$p$," and randomly programmed in successive and/or infinite intervals of $p$ such that instantaneous changes of voltage ($V_L$), current ($I_L$) and power factor (Cos $\phi$) are appropriately scaled.

This function $m$ is mechanized as shown in the block diagram shown in FIG. 4. The actuating switch 72 coupled to the magnetic circuits 74 of the meter responds to drive signals from the variable-rate generator 76 and either allows current to flow through the voltage-sensing coil of the magnetic circuits 74 of the meter or inhibits the same. The generator 76, typically, is a gated fixed frequency oscillator. The turn on-and-off time within a single power source cycle (assume 60 cycles as an example) time interval is further controlled, to minimize transient induced errors in the mechanization.

The function $m$ is generated by the programmer 78. Typical time intervals generated are:

$t0$, crystal clock, or line frequency interval
$t1$, 60-cycle turn-on delay
$t2$, 60-cycle turn-off delay
$t3$, 1 second
$t4$, 6 seconds
$t5$, 60 seconds
$t6$, 1 hour
$tn$, any hour in 24 hours
$tw$, day of the week
$tm$, month of the year.

The variable-rate electric adapting device indicated generally at 80 in FIG. 4 contains means for the storage of rates, normalized 0 to 1 equal to maximum meter rate, and time intervals to which these rates apply. The programmer 78 which, typically, is in the form of a 256 × 4 bit RAM and logic, continuously delivers the scaled quantity $m$ to the magnetic circuits 74 of meter 80 via switch 72 and generator 76, the scaling quantity depending upon the timing interval desired, for example, the hour of the day, the day of the week, the week of the month, or the month of the year, or any single or multiple combination thereof, and depending upon the predetermined rate for that interval. The programmer 78 is programmable to provide an output signal to actuate major appliances during reduced-rate periods.

The function of actuating switch 72 is mechanized using, for example, a solid state relay or any other suitably applied electronic components to perform the switching function. Typically, actuating switch 72 may utilize a TRIAC or SCR circuit.

The programming element 78 is arranged to address the voltage coil of the magnetic circuits 74 only at the desired time intervals and at the predetermined rate set therefor, the address coinciding with control signals from a timing device 82, the timing device being in the form of a digital clock. The timing device 82 is synchronized and mechanized using either the power line source 84 or an auxiliary power supply 86 such as a battery, chargeable or non-rechargeable, and which drives a crystal oscillator, the latter being coupled to the timing device to provide continuity during line power outages. This important feature negates the requirement of the utility company to reset all meters as a result of intermittent line power failure. The timing device 82 may be synchronized by any of the following external sources: manual means, radio controlled and actuated, including standard broadcast stations, or power source control signals, e.g., a ripple system.

As discussed hereinbefore, the rate function may be stored in the programming element 78, the latter being either pre-programmed or continuously programmed by data links, referenced generally by the numeral 88. The data links may be in the form of radio controlled signals, signals superimposed on the power source-lines, e.g., ripple systems, or signals from the utility company via telephone lines or signals applied by manual means. In addition, the rate profile may be changed or varied by separate profile changes, referenced generally by the numeral 90. Such changes, typically, include transducer elements, i.e., a temperature sensor, a source line-voltage sensor and a load sensor. The temperature sensor is operative in a manner in which, when desired outside or inside temperatures are reached, activation or deactivation of devices takes place via load control outputs 92 and which provides the proper rate multiplier to the watt-hour meter.

The source line-voltage sensor is operative to effect actuation of the programmer 78 when predetermined limits of voltage are reached such that rates can be changed when the source is overloaded and conservation of energy is desirable. Similarly, the load sensor is employed to sense when a load level has reached a predetermined level and rates are adjusted for any overload condition or incremental overload conditions.

The signals applied to the programmer 78 thus provide rate changes which can be of simple control nature or complex in form where the information transmitted contains rate information, signals to disconnect loads, signals to defer loads along with signals between the metering device and a utility control point.

A load control bypass 94 allows the consumer the option of energizing the controlled appliances at their discretion. The load control bypass is shown, for illustration purposes, as being coupled to switched loads 96.

An indicator lamp 98 is provided and serves to emit light during reduced-rate periods to allow the consumer to self-check the system.

From a detailed consideration of this description, it will be apparent to those skilled in the art that this invention may be employed in a number of different ways through the use of routine skill in this field. For this reason, the present invention is not to be considered as being limited except by the appended claims defining the invention.

I claim:

1. A programmable variable-rate electric adapting device for watt-hour meters comprising:
   first terminals for connecting to the contact jaws of a watt-hour meter socket receptacle;
   second terminals for connecting to the blades of a watt-hour meter; and
   a variable rate circuit coupled to said first and second terminals so as to be in parallel with the line voltage measuring coil of the watt-hour meter, said variable rate circuit comprising:
   a digital clock for generating signals establishing the time;
   a programmer coupled to said digital clock to receive said signals establishing the time, to select a predetermined scaling rate stored in said programmer based upon the time, and to provide an output signal that is indicative of said selected predetermined scaling rate;

a variable generator coupled to said programmer to receive said selected predetermined scaling rate output signal and to generate switch drive signals corresponding to said selected predetermined scaling rate; and a solid state actuating switch coupled to said variable generator and coupled to the line voltage measuring coil of the watt-hour meter when said variable-rate circuit is coupled to said second terminal, said actuating switch responding to said switch drive signals to either allow current from the line to flow through the line voltage measuring coil during an on cycle or to prevent current from flowing through said line voltage measuring coil during an off cycle.

* * * * *